(12) United States Patent
Vessa

(10) Patent No.: US 8,741,071 B2
(45) Date of Patent: Jun. 3, 2014

(54) SEMICONDUCTOR PROCESSING METHOD

(75) Inventor: Tony Vessa, Meylan (FR)

(73) Assignee: Freescale Semiconductor, Inc., Austin, TX (US)

( * ) Notice: Subject to any disclaimer, the term of this patent is extended or adjusted under 35 U.S.C. 154(b) by 404 days.

(21) Appl. No.: 12/811,449

(22) PCT Filed: Jan. 9, 2008

(86) PCT No.: PCT/IB2008/051269
§ 371 (c)(1),
(2), (4) Date: Jul. 1, 2010

(87) PCT Pub. No.: WO2009/087492
PCT Pub. Date: Jul. 16, 2009

(65) Prior Publication Data
US 2010/0275951 A1 Nov. 4, 2010

(51) Int. Cl.
*B08B 3/00* (2006.01)
*H01L 21/00* (2006.01)
*H01L 21/02* (2006.01)
*H01L 21/31* (2006.01)
*H01L 21/311* (2006.01)
*H01L 21/67* (2006.01)
*B08B 3/08* (2006.01)

(52) U.S. Cl.
CPC .... *H01L 21/02052* (2013.01); *H01L 21/31133* (2013.01); *H01L 21/67051* (2013.01); *H01L 21/6708* (2013.01); *B08B 3/08* (2013.01); *Y10S 134/902* (2013.01)
USPC .......... 134/36; 134/2; 134/3; 134/26; 134/28; 134/29; 134/50; 134/94.1; 134/95.1; 134/97.1; 134/902

(58) Field of Classification Search
USPC ....................................................... 134/97.1
See application file for complete search history.

(56) References Cited

U.S. PATENT DOCUMENTS

| 3,900,337 A | 8/1975 | Beck et al. |
| 5,634,980 A | 6/1997 | Tomita et al. |

(Continued)

FOREIGN PATENT DOCUMENTS

| WO | 99/50898 A1 | 10/1999 |
| WO | 99/63404 A1 | 12/1999 |

(Continued)

OTHER PUBLICATIONS

Hossain-Pas S D et al: "Feasibility of Analysis of Silicon Surface Cleaning Using Time-of-Flight Secondary Ion Mass Spectrometry" Proceedings of the Fourth International Symposium on Cleaning Technology in Semiconductor Device Manufacturing Electrochem, SOC Pennington, NJ, USA, 1996, pp. 508-517.

(Continued)

*Primary Examiner* — Joseph L Perrin
*Assistant Examiner* — Levon J Shahinian

(57) ABSTRACT

A process for treating the surface of a substrate in the manufacture of a semiconductor device. The process comprises providing a concentrated acid or base, a peroxide and water, and delivering the acid or base, the peroxide and the water to the surface of the substrate. The acid or base and the water are delivered separately to the surface of the substrate and allowed to mix on the surface, and the water is delivered in pulses. The present invention also provides an apparatus adapted to carry out this process.

20 Claims, 2 Drawing Sheets

(56) References Cited

U.S. PATENT DOCUMENTS

| | | | |
|---|---|---|---|
| 5,861,064 A | 1/1999 | Oikari et al. | |
| 6,383,724 B1 | 5/2002 | Carter et al. | |
| 6,645,874 B1 * | 11/2003 | Torek et al. | 438/723 |
| 7,144,673 B2 | 12/2006 | Chen et al. | |
| 2004/0000322 A1 | 1/2004 | Verhaverbeke | |
| 2005/0158671 A1 | 7/2005 | Shimizu et al. | |
| 2006/0008784 A1 | 1/2006 | Schmincke | |
| 2006/0264051 A1 * | 11/2006 | Thibaut | 438/690 |

FOREIGN PATENT DOCUMENTS

| | | |
|---|---|---|
| WO | 2004/008249 A2 | 1/2004 |
| WO | 2006/107517 A2 | 10/2006 |
| WO | 2006/113621 A2 | 10/2006 |

OTHER PUBLICATIONS

International Search Report and Written Opinion correlating to PCT/IB2008/051269 dated Sep. 4, 2008.

* cited by examiner

SEMICONDUCTOR PROCESSING METHOD

FIELD OF THE INVENTION

The present invention relates to a process for treating the surface of a substrate in the manufacture of a semiconductor device and to a substrate processing system for carrying out this process.

BACKGROUND TO THE INVENTION

During the manufacture of a semiconductor device from a semiconductor substrate, the surface of the substrate can become contaminated with residues. The contamination may be deliberate, for example with the deposition of resist on a surface, or the contamination may be unintentional, for example residues left on a substrate after Chemical Mechanical Polishing (CMP).

One method of removing residues from a surface is to rinse the surface with a mixture of concentrated acid or base and a peroxide. Typically, as described in U.S. Pat. No. 3,900,337, the acid is sulphuric acid. If a base is used, it is typically ammonium hydroxide. The peroxide is typically hydrogen peroxide.

For a hydrogen peroxide/sulphuric acid mixture (which is known as 'piranha' solution), peroxy-monosulphuric acid is formed under equilibrium conditions:

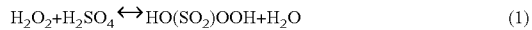

$$H_2O_2 + H_2SO_4 \leftrightarrow HO(SO_2)OOH + H_2O \qquad (1)$$

Peroxy-monosulphuric acid is more commonly known as 'Caro's acid'. It is a strong oxidizing agent and it is thought that this component is particularly effective in removing residues from a substrate.

In the past, two principle methods of removing residues with this type of solution have been used. The first, as described in U.S. Pat. No. 3,900,337, is simply immersing the substrate in a bath containing a mixture of peroxide and acid or base. One problem with this method is that the bath containing the cleaning solution can itself quickly become contaminated with residues, which can lead to reduced cleaning effectiveness. This can also lead to increased financial and environmental costs because the components of the solution need to be changed relatively frequently, and both peroxides and concentrated acids and bases are relatively expensive and have a relatively high environmental impact. In addition, sometimes this method does not adequately remove particularly hard-to-remove residues or contaminants.

The second method is to spray the substrate with a mixture of peroxide and acid or base while rotating or spinning the substrate. The mixture then spreads over the surface of the substrate by virtue of the centrifugal force created by the rotating substrate. An example of this second approach is described in U.S. Pat. No. 5,634,980. One problem with this second approach is that it takes a long time to remove organic residues using this technique. This is especially the case for hard-to-remove residues such as resist. At the same time, the environmental cost of the process increases.

Therefore, the present inventors have researched a new method of removing residues from the surface of a substrate during semiconductor processing. This method is aimed at addressing at least some of the drawbacks of the prior art.

SUMMARY OF THE INVENTION

The present invention provides a process and a semiconductor processing system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

DETAILED DESCRIPTION OF THE INVENTION

Figure 1:
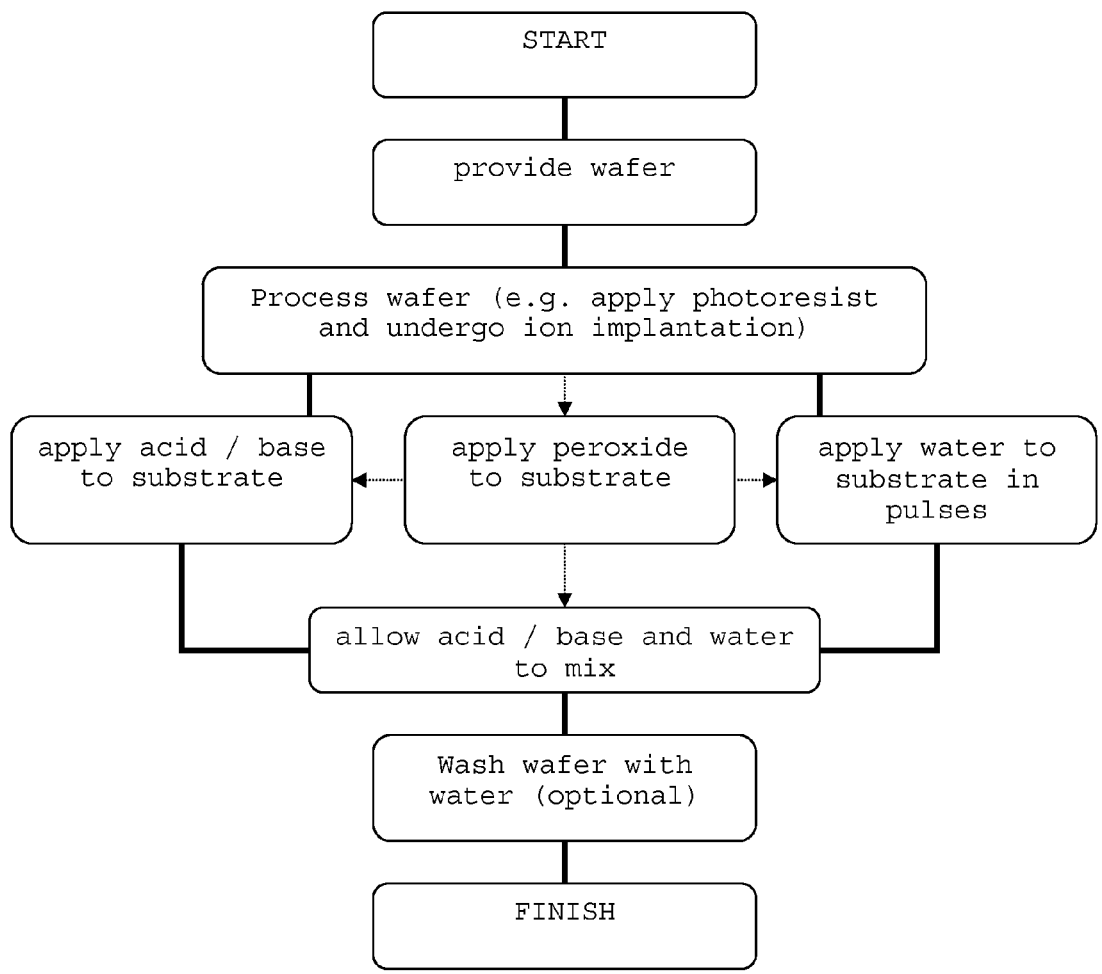
FIG. 1 shows a flow-chart of an example of a process in accordance with the invention.

An example of a process for cleaning residues from the surface of a substrate during semiconductor processing may involve delivering an acid or base and water to the surface of the substrate. The acid or base and the water are delivered separately to the surface so that the water mixes with the acid or base on the surface of the substrate, producing heat. A peroxide is delivered to the surface of the substrate at the same time. The peroxide may be pre-mixed with the acid or base before being delivered to the surface of the substrate, although it may also or alternatively be delivered mixed with the water or be delivered separately from the other components. As explained below, without whishing to be bound to any theory, it is found that the heat produced by the mixing of the acid or base and the water may enhance the removal of contaminants (e.g. which are organic in nature) from the surface of the substrate.

Although not wishing to be bound by theory, the inventors have identified two possible factors that may contribute to the increase in cleaning efficiency caused by the mixing of the acid or base and water on the surface of the substrate. The first is a general factor that applies to all concentrated acids or bases. Since the water and the acid or base are delivered separately to the surface, they will first contact one another actually on the surface. The inventors have found that the way that the heat produced by this mixing at the surface of the substrate is not uniform across the surface of the substrate. Instead, heat is produced at the specific points of contact of the acid or base with water. This results in heat being produced 'locally' at the surface.

Over time, the heating effect caused by the contact of the acid or base with the water is dissipated or evened out as the concentration of acid or base becomes constant throughout the mixture. Therefore, if the water and the acid or base are mixed prior to being delivered to the surface of the substrate, the substrate is exposed to a solution having a more or less uniform temperature. However, if, as in the present invention, the water and the acid or base mix actually on the surface of the substrate, heating occurs locally at the particular points on the surface where mixing occurs. As a result, heat gradients are thought to be formed across the surface of the substrate.

This local heating at the surface of the substrate is thought to be more effective at removing residues, in particular resist, than with a mixture heated to a constant temperature. This is because the surface is, in effect, subject to 'thermal shock' where the surface is exposed to an 'unmixed' temperature and to a greater 'mixed' temperature. The 'mixed' temperature is also greater than the temperature of a mixture on its way to or allowed to reach thermal equilibrium. Due to the local nature of the heating effect, the surface can potentially be exposed to both environments shortly after one another. This mixture of environments is thought to increase the rate at which residues are removed.

There is a second factor that is thought to contribute to the increase in cleaning efficiency caused by the mixing of the acid or base and water on the surface of the substrate. This factor relates to the formation of some active cleaning species that are thought to be involved in the cleaning process. Generally speaking, the local heating effect caused by the mixing of the acid or base and water may also result in a greater concentration of some active cleaning species being created at the surface. For example, some active cleaning species are thought to be created by the breakdown or reaction of the peroxide, the rate of which is temperature-dependent. Therefore, a rapid increase in temperature may result in a rapid increase in the concentration of active species. The local concentration of active species produced in this way at the points of mixing of the acid or base and water is thought to be greater than the concentration in a solution that has reached thermal equilibrium. These active species may, for example, be reactive oxygen species. They are thought to play a role in the removal of some contaminants from the surface of a contaminated substrate, in particular organic contaminants such as implanted photoresist.

In a hydrogen peroxide/sulphuric acid mixture, a particularly effective active cleaning species is thought to be Caro's acid. In contrast to some other active cleaning species, this is thought to be formed under equilibrium conditions as shown in equation (1). Without whishing to be bound to any theory, the inventors hypothesise that the position of the equilibrium shown in equation (1) is temperature dependent. Specifically, as the temperature increases, it is thought that the equilibrium shifts to the right—i.e. as the temperature increases, a greater amount of Caro's acid is produced. This may be a result of the enthalpy of the reaction and Le Chatelier's principle. In addition, as the temperature increases, there will a greater tendency for the water produced in (1) to be in vapour form, which may favour the formation of Caro's acid for entropic reasons.

Having recognised that the cleaning efficiency of a peroxide/acid or base combination may be increased by augmenting the 'thermal shock' experienced at the surface of the substrate, the inventors have looked to increase this 'thermal shock' and temperature rise produced at the surface of the substrate. The inventors have found that a further increase in cleaning efficiency may be achieved by delivering the water to the surface of the substrate in pulses (i.e. intermittently). Again not wishing to be bound by theory, this may be because applying water intermittently maintains a high concentration of acid or base and peroxide at the surface, thereby maintaining conditions favoured for the formation of a high concentration of active cleaning species, while still producing thermal shock. In addition, it may increase concentration gradients of the acid or base across the surface of the substrate, and cause the heating effect resulting from acid or base/water mixing to be more localized.

Whatever the causes of the increase in cleaning effect, the effectiveness of mixing the acid or base component with water actually on the surface of the substrate while delivering the water in pulses is demonstrated by the Examples. In these examples, a substrate having photoresist on it is cleaned either by a sulphuric acid/hydrogen peroxide mixture by itself or by the acid/peroxide mixture and water applied in pulses separately to the surface at the same time. It is seen from this example that the acid/peroxide mixture by itself takes 50 seconds to reliably clean the substrate; in contrast, using the acid/peroxide mixture in combination with pulsed water takes only 30 seconds to reliably clean the substrate.

It should be noted that, although the peroxide may be mixed with the acid or base prior to their application to the surface, the peroxide and acid or base may also be delivered separately to the surface and allowed to mix on the surface of the substrate. For example, the peroxide may be delivered independently to the surface of the substrate. Alternatively or additionally, the peroxide may be delivered mixed with the water prior to application to the surface of the substrate. While the pre-mixing of the peroxide and acid or base may be advantageous to ensure that sufficient mixing occurs to form certain active species that remove contaminants effectively, applying the peroxide and acid or base separately to the surface of the substrate may enhance the 'thermal shock' effect caused by mixing, thereby potentially enhancing the cleaning ability of the process. This is because the peroxide may be supplied as an aqueous solution, and therefore mixing the acid and peroxide itself produces some heat.

An example of a process in accordance with the present invention is illustrated in FIG. 1. It should be understood that this Figure does not illustrate every step that may be involved in a cleaning process. For example, the process may be used before or after a rinse with deionised water. It may also be used in conjunction with other conventional cleaning techniques, especially those used to remove photoresist. For example, it may be used in conjunction with an ashing technique, such as that described in US 2006/008784, in which a cleaning process combining a piranha solution rinse with dry etching by an oxygen plasma is illustrated. However, a process in accordance with the present invention can also be used on its own because of its effectiveness in cleaning. This is advantageous over other cleaning techniques because it reduces the total amount of time taken to clean a substrate.

As illustrated in FIG. 1, an example of a cleaning process may start by providing a substrate, in this example a wafer, having contaminants on its surface. The process may be used to remove a wide range of contaminants, for example organic contaminants, and in particular to remove photoresist (e.g. a film or layer of photoresist).

A resist pattern may be formed from solution on the surface of a substrate during semiconductor manufacture. The resulting film on the substrate may be baked, then patterned and 'developed'. The thickness of a resist film is typically up to 5 micrometers, for example from 0.1 micrometers, or 0.2 to 2 micrometers, dependent on the use of the resist.

Patterning of the resist (e.g. photoresist) by exposure to, for example, electromagnetic radiation (e.g. UV or X-ray) or electron or ion beams, generally occurs in two ways. Firstly, for 'positive tone' resist, areas exposed to the radiation become soluble while unexposed areas remain insoluble. For 'negative tone' resist, the situation is reversed: exposed areas become insoluble while unexposed areas are soluble. The resist film may also contain only one layer of resist or a bilayer or several different layers, depending on its application.

Resist may be used for several purposes. For example, resist may be used to achieve the selective etching of a substrate. It may also be used as a mask for ion implantation. During ion implantation, ions are implanted into the underlying substrate at high energy. Examples of elements that are implanted in this way are phosphorous, arsenic, and boron. Ion implantation may be carried out at an energy of 1 keV or greater, for example 2.5 keV or greater (e.g. 10 keV or less).

The amount of ions implanted may be $10^{13}/cm^2$ or greater, for example $5\times10^{14}/cm^2$ or greater.

The inventors have found that resist subjected to ion-implantation is particularly difficult to remove with conventional techniques. It is thought that this may be because ion implantation may cause the resist to cross-link and form a crust that is more difficult to remove than un-implanted resist. Therefore, a process in accordance with the present invention may be used to remove a resist film from a substrate after ion implantation. Accordingly, in an embodiment, a process for treating the surface of a substrate in the manufacture of a semiconductor device may comprise:
 (i) providing a substrate having a layer of resist covering at least part of its surface;
 (ii) subjecting the substrate to ion-implantation; and then
 (iii) removing the resist from the substrate by treating the substrate with a concentrated acid or base, a peroxide and water as described herein.

A process in accordance with the present invention may use any acid or base. The acid or base produces heat when mixed with water. In order to be able to produce heat in this way, the acid or base is provided in concentrated form. The term 'concentrated' is well known to the person skilled in the art. In the present case, the acid or base is provided sufficiently concentrated to produce heat when mixed with water. The concentrated acid or base may be provided having an acid or base content of 75 wt % or more, such as 90 wt % or more, e.g. about 98 wt % or more, for example about 99.5 wt % or more. In other words, the concentrated acid or base may have a water content of 25 wt % or less, such as 10 wt % or less, e.g. about 2 wt % or less, for example about 0.5 wt % or less.

If the acid or base is delivered to the surface in concentrated form (i.e. not having been mixed with any other components), the water content of the acid or base is the water content of the concentrated acid or base. However, the acid or base may be mixed with other components, such as the peroxide, before it is applied to the surface. Accordingly, so that the acid or base is at sufficient concentration to produce heat when mixed with water, the mixture comprising the acid or base delivered to the surface may have a water content of 60 wt % or less, such as 30 wt % or less, e.g. 20 wt % or less, for example about 10 wt % or less, such as 5 wt % or less.

Examples of acids that may be used in the present invention include hydrochloric acid (HCl), nitric acid ($HNO_3$), phosphoric acid ($H_3PO_4$) and sulphuric acid ($H_2SO_4$). The acids may, for example, be strong acids (i.e. the acid completely dissociates in aqueous conditions—this is thought to occur for acids with a $pK_a$ of about 1.7 or less). If the acid is a strong acid, the amount of heat released on mixing with water may be maximized. The acid may comprise or may be sulphuric acid. This is because the inventors have found that sulphuric acid is particularly suited for removing contaminants from a contaminated substrate.

Examples of bases that may be used in the present invention include hydroxides such as ammonium hydroxide, potassium hydroxide, sodium hydroxide and calcium hydroxide. The bases may be strong bases. The base may be ammonium hydroxide.

Examples of peroxides that may be used in the present invention include hydrogen peroxide and organic peroxides, for example in the form ROOH where R is an organic (i.e. carbon-containing) group (e.g. an alkyl group). The peroxide may be a water-soluble peroxide. The peroxide may be hydrogen peroxide because it is suited to produce the type of active species used to remove contaminants from contaminated substrates in the process of the present invention.

The inventors have found that a combination of concentrated sulphuric acid and hydrogen peroxide is particularly suited for use in the present invention. As a separate example, a combination of concentrated ammonium hydroxide and hydrogen peroxide may also be used.

As the skilled person will recognise, a wide range of substrates may be used in the present invention. For example, the substrate may be made of a semiconductor material. The substrate may comprise silicon, germanium or gallium arsenide, and combinations thereof. The substrate may comprise regions of dielectric material and/or semiconducting material and/or conducting material, such as copper interconnects.

In a process in accordance with the present invention, the peroxide (e.g. hydrogen peroxide) may be provided in any suitable concentration. The peroxide (e.g. hydrogen peroxide) may for example be provided at a concentration of 70 weight % or less in water, for example 50 weight % or less, such as 40 weight % or less. Also, the peroxide may be provided at a concentration of 10 weight % or more, for example 20 weight % or more. The peroxide may be provided at a concentration of 10 to 70 wt %, for example about 30 weight % in water (laboratory strength hydrogen peroxide is provided at 31% by weight concentration in water, i.e. each 100 g of solution contains 31 g of hydrogen peroxide). Thereby, the 'thermal shock' effect at the surface of the substrate may be increased and an insufficient exothermic reaction of the subsequent peroxide/acid or base mixture when mixed with water may be prevented.

As shown in FIG. 1 by the dotted lines, the peroxide may be pre-mixed with the water and/or, with the acid or base being applied to the surface of the substrate. For these cases, the above concentrations are the concentration of the peroxide prior to the mixing of the peroxide with the water or the acid or base. Alternatively or additionally, as shown in FIG. 1, the peroxide may be delivered separately to the surface from either the water or acid/base.

Additives may be included in the peroxide. For example, stabilizing additives may be added to stabilize the peroxide from decomposing prior to use.

In an example of a process in accordance with the present invention, 1 part of acid (e.g. sulphuric acid) or base (e.g. ammonium hydroxide) may be used with 0.01 to 0.5 parts of peroxide (e.g. hydrogen peroxide). These ratios are given in terms of weight of the undiluted components and not in terms of the weight percentage of the solutions themselves. For example, in order to obtain about a 1:0.075 mixture of sulphuric acid to hydrogen peroxide, 100 g of 98 wt % sulphuric acid would be mixed with approx. 25 g of 30 wt % hydrogen peroxide. Thereby, an effective amount of active cleaning species (e.g. Caro's acid for a sulphuric acid/hydrogen peroxide mixture) produced in the mixture of the two components can be obtained. A range of compositions having an acid or base to peroxide weight ratio of 1:0.02 to 1:0.2, for example 1:0.05 to 1:0.15, may increase the cleaning efficiency of the process.

If the peroxide is in aqueous form and is mixed with the concentrated acid or base, heat is evolved. This means that, if an aqueous peroxide is mixed with the acid or base prior to their application to the surface, the mixture heats up. Accordingly, the peroxide and acid or base may be mixed in situ prior to their application to the surface, for example in the nozzle of an apparatus applying the mixture to the substrate. Alternatively, the peroxide and acid or base may be mixed beforehand and allowed to reach, or be heated up to, a predetermined temperature before their application to the substrate.

If an acid or base/peroxide mixture is prepared, it is preferably delivered to the substrate at a temperature of 50° C. or above. If the mixture is delivered to the substrate at a temperature of less than 50° C., the cleaning capacity of the mixture may decrease. The mixture may be delivered to the substrate at a temperature of 110° C. or less, e.g. at a temperature of 100° C. or less. This range of temperatures may be achieved by mixing the acid or base and peroxide in situ. If mixing the two components in situ, the peroxide and acid or base may be provided at a temperature before mixing of 5 to 50° C., for example 10 to 35° C., for example 20 to 25° C. In other words, the peroxide and acid or base may be provided in neat form at ambient temperature.

The acid or base and peroxide may be delivered to the surface of a substrate at a combined flow rate of 25 ml to 500 ml per minute, for example 50 ml to 200 ml per minute. This is for a typical 300 mm diameter substrate, and the skilled person will understand that the flow rate may be adjusted according to the diameter of the substrate. The mixture may be provided continuously and may be provided at constant flow rate, although the flow rate of the mixture may vary over time, or the mixture may be provided intermittently. However, when the acid or base and peroxide are delivered to the surface, water is delivered to surface of the substrate in a manner so that the acid or base and the water first mix on the surface of the substrate rather than before reaching the substrate. The water may be deionised water, for example ultra-high purity water. The water may be pure water. In other words, it may contain no additives.

The water may be delivered in pulses. As used herein, water delivered in 'pulses' means that water is delivered to the surface intermittently. The ratio of the rate of flow of the water during a pulse and after the pulse may be at least 10:1, such as at least 25:1. Alternatively, there may be no flow of water after a pulse, i.e. the water is completely turned off.

Figure 2:
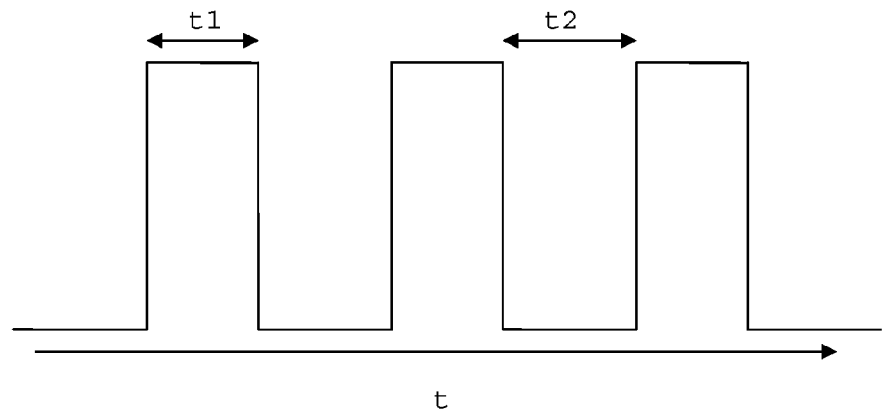
FIG. 2 shows a timing diagram of water being delivered in pulses according to an example of a process in accordance with the present invention.
Figure 3:
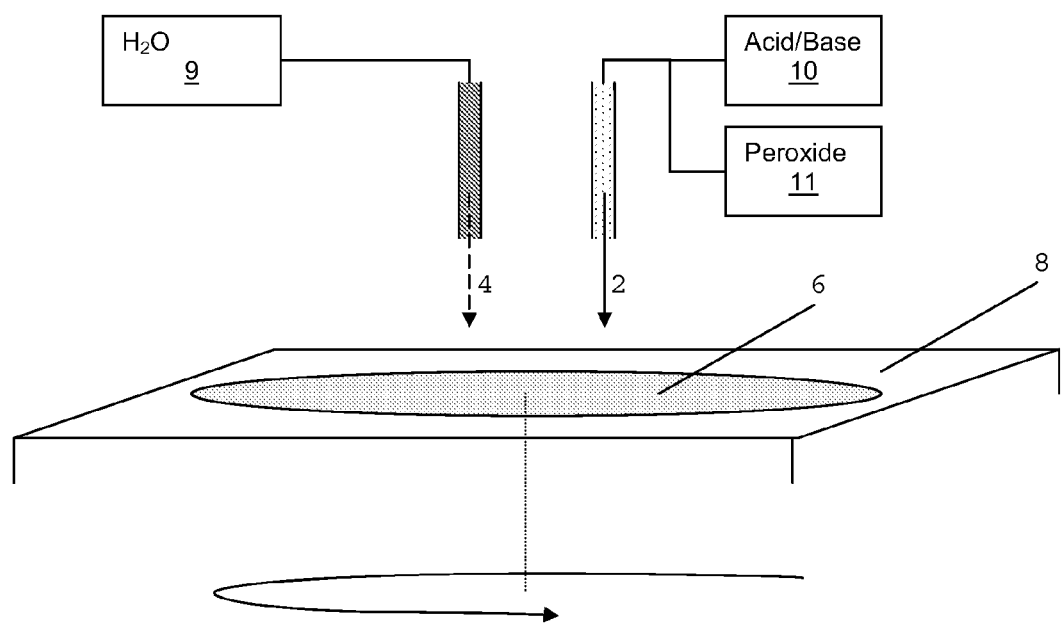
FIG. 3 shows a perspective view of an example of an embodiment of an apparatus in accordance with the invention.

An example of the manner in which water may be delivered to the surface is illustrated in FIG. 2. This Figure shows how water is delivered to the surface during a period of time t1. After t1, the rate of flow of water is reduced or stopped. The flow of water may for example be reduced to at least $\frac{1}{10}^{th}$ of its previous flow. Alternatively, the flow of water may be stopped so that no water is delivered to the surface of the substrate. During a further period of time t2, water starts to be delivered to the surface again at its higher rate. Although the length of pulses (t1), the length of the intervals between pulses (t2) and the peak flow rate for each pulse in FIG. 3 are shown as constant, one or more of these variables may be variable.

The length of a pulse of water (t1) may be 0.25 to 10 seconds, for example 1 to 5 seconds in length, such as about 1 second in length. The length between one pulse and the next pulse (t2) may be from 0.1 to 10 seconds in length, for example from 1 to 5 seconds, such as about 4 seconds in length. The ratio of t1 to t2 may be in the range of 4:1 to 1:20, for example from 1:1 to 1:10, such as from 1:1 to 1:5, for example about 1:4.

The temperature of the water may be 5 to 50° C., for example 10 to 35° C., for example about 20 to about 25° C. In other words, the water may be provided at ambient or room temperature.

When delivered to the substrate unmixed with either the acid or base or the peroxide, the water may be delivered to the surface of a substrate at a flow rate of 25 ml to 500 ml per minute, for example 50 ml to 200 ml per minute. This refers to the flow rate of water delivered to the substrate separately from the flow containing the acid or base. This is for a typical 300 mm diameter substrate, and the skilled person will understand that the flow rate may be adjusted according to the diameter of the substrate. When the water is being delivered in pulses, the flow rate refers to the average flow rate over the pulse cycle (i.e. it indicates the total amount of water delivered to the substrate per minute).

In total, suitable ranges for the relative amounts of acid or base to water delivered to the substrate in terms of volume are found to be 1:5 to 20:1, for example 5:1 to 1:2, such as about 3:1. For these ratios, the 'water' only includes the water that is delivered to the surface of the substrate separately from the acid or base. In other words, if the acid or base is pre-mixed with aqueous peroxide, these ratios do not include the water contained in the aqueous peroxide. These relative amounts may maximize the heat produced upon mixing of the acid or base with other components. If the peroxide and acid or base are pre-mixed prior to their delivery to the surface, the relative amount of the acid or base/peroxide mixture (including any water included in the mixture) to the water delivered separately to the surface in terms of volume is 1:4 to 10:1, for example 1:2 to 5:1. This may maximize the thermal shock at the surface of the substrate.

While the acid or base, peroxide and water are being delivered to the surface of the substrate, the substrate may be held still. Alternatively, the substrate may be moving relative to the supplied fluids, and for example be rotating (spinning) This may be advantageous because it facilitates the mixing of the water and the acid or base. The substrate may rotate at a rotation speed of 10 to 500 rpm, for example 50 to 250 rpm. Rotation at these speeds may facilitate the mixing of the water and acid/peroxide mixture, thereby allowing for more efficient cleaning.

In some embodiments, further additives may be added to any one of the acid or base, peroxide or water. Usually, the additives will be most soluble in the water and therefore be contained in the water. For example, surfactants, chelators, anti-oxidants and/or corrosion inhibitors may be added. These may be added to increase the cleaning efficiency of the process. However, in other embodiments no additives may be included. This is advantageous since it reduces the cost of and simplifies the process of preparing the cleaning solution.

As previously described, the thermal shock produced by mixing the acid or base and water on the surface of the substrate can involve local areas of the liquid being heated to a greater temperature than simply by mixing the peroxide and acid or base prior to their application to the surface. This temperature increase can be measured by using a thermal laser probe to measure the temperature of the top of the liquid surface. Alternatively, this temperature can sometimes be measured by a thermal tape that measures the maximum temperature observed, depending on the chemical compatibility of the tape with the mixture on the surface of the substrate. When water is applied continuously to the substrate, a temperature of, for example 100 to 130° C. may result at the points of mixing (e.g. 105 or 110 to 125° C.). When water is applied in pulses, a greater temperature may be achieved at some points on the surface, for example 135 to 190° C. (e.g. 145 to 175° C.). As a result, the thermal shock and cleaning effect caused by 'pulsing' the water is thought to be greater than that produced by a continuous flow of water.

The present invention also provides an apparatus adapted to carry out the above process. This apparatus comprises: a wafer holder, a first delivery system connected to a water source, a second delivery system connected to a source of concentrated acid or base, means for providing a peroxide, either through the first and/or second delivery systems or through a third delivery system, and a controller arranged to control the first and second delivery systems and the means for providing the peroxide, the controller comprising instructions that, when executed by the controller, deliver the acid or base, the peroxide and the water to the surface of the substrate, wherein the instructions, when executed by the controller, deliver the acid or base and the water separately to the surface of the substrate and allow them to mix on the surface, and deliver the water in pulses. The controller may also contain appropriate instructions for carrying out other aspects of the process of the present invention. Optionally, these instructions may be stored on a computer-readable medium contained in the controller.

The first, second and optional third delivery systems may comprise a pump to deliver liquids to the surface of the substrate. The apparatus may include a source of water, a source of concentrated acid or base and a source of peroxide. The peroxide is delivered to the surface of the substrate with the second delivery system.

An example of an embodiment of such an apparatus is illustrated in FIG. 3. It shows a first delivery system 2 and a second delivery system 4. These are shown offset from the centre, although this need not be the case. These two delivery systems may also not be fixed in position. For example, in order to increase the area exposed to thermal shock, the first delivery system and/or the second delivery system may be moved while in use. This can be achieved by attaching the means for delivery to a pivot that swings across the width of the substrate. In addition, the first delivery system may comprise a spray nozzle that causes the water to be applied to the surface of the substrate in the form of a spray. The first delivery system 2 may be connected to a water source 9 and the second delivery system 4 may be connected to a source 10 of acid or base.

In the shown example of an embodiment, the peroxide is delivered to the substrate by the second delivery system and the second delivery system 4 is connected to a source 11 of peroxide. In this case, the delivery system may for example comprise a nozzle in which the peroxide and acid or base are allowed to mix. Alternatively, the peroxide and acid may be allowed to mix before reaching any nozzle.

The water, acid or base and the peroxide may be provided in any manner suitable for the specific implementation. For example, the water may be delivered to the substrate in a fan spray or mist spray rather than directly. This can be achieved by providing the water source with a nozzle adapted to produce a fan spray or mist. This is thought to be potentially more effective since it reduces the 'local' dilution of the acid or base and peroxide, which may lead to a greater local concentration of active cleaning species being formed when heat is produced on the mixing of the water and the acid or base.

During use, the substrate 6 is rotated on the substrate holder 8 at a predetermined rate of rotation. The water may be applied in pulses.

It should be noted that, unless otherwise explicitly stated, the features of one embodiment are equally applicable to any other embodiment. Accordingly, the features of the apparatus of the present invention also reflect the features of the process of the present invention.

Experimental Results

A silicon substrate was prepared. Photoresist (UV56) was patterned on the substrate to a resolution of 46 nm. The substrate was then subject to ion implantation by arsenic (to a concentration of $10^{15}$ ions/cm$^2$ at 3 keV). The substrate was then subject to cleaning by either:

a) an acid/peroxide mixture only; or
b) an acid/peroxide mixture and water, with these two components supplied separately to the surface of the substrate and allowed to mix on the surface of the substrate.

The acid used was sulphuric acid and the peroxide used was hydrogen peroxide. Concentrated sulphuric acid (containing 2 wt % or less of water) and laboratory strength (31 wt %) hydrogen peroxide were used in a ratio of about 4:1. In (b), the acid/peroxide mixture is applied continuously while the water is applied in pulses. The pulses consisted of 1 second applying the water followed by 4 seconds of not applying the water.

The results are shown in table 1 on the next page.

These results firstly show that the acid/peroxide mixture when used by itself takes 50 seconds to reliably clean the substrate; in contrast, using the acid/peroxide mixture in combination with pulsed water takes only 30 seconds to reliably clean the substrate.

These results also show that sometimes the cleaning process is unpredictable. For example, on one occasion, a satisfactory clean was obtained using the acid/peroxide mixture on its own for only 36 seconds (Example 1-6), while on two occasions, satisfactory results were not achieved using the same cleaning mixture for 40 seconds. The use of the acid/peroxide mixture in combination with pulsed water appears to produce more reliable results than the acid/peroxide mixture by itself because examples 1-8 to 1-19 closely follow a trend of cleaning effectiveness.

TABLE 1 examples 1-1 to 1-19

| Example | Cleaning method | Cleaning time (s) | Cleaning result |
| --- | --- | --- | --- |
| 1-1 | a | 60 | Clean |
| 1-2 | a | 50 | Clean |
| 1-3 | a | 50 | Clean |
| 1-4 | a | 40 | Edge residue |
| 1-5 | a | 40 | Edge residue |
| 1-6 | a | 36 | Clean |
| 1-7 | a | 30 | Bad residue |
| 1-8 | b | 30 | Clean |
| 1-9 | b | 30 | Clean |
| 1-10 | b | 30 | Clean |
| 1-11 | b | 30 | Clean |
| 1-12 | b | 30 | Clean |
| 1-13 | b | 20 | Clean |
| 1-14 | b | 25 | Edge residue |
| 1-15 | b | 25 | Edge residue |
| 1-16 | b | 20 | Edge defects |
| 1-17 | b | 20 | Residue |
| 1-18 | b | 20 | Residue |
| 1-19 | b | 15 | Bad residue |

The invention claimed is:

1. A process for removing resist from the surface of a substrate in the manufacture of a semiconductor device, the process comprising:
   providing a mixture of a peroxide and one of concentrated acid or concentrated base, and separately providing water;
   delivering the water and the mixture of peroxide and one of acid or base separately and concurrently to a substrate having resist on its surface; and
   allowing the water and the mixture of peroxide and one of acid or base to mix on the surface to remove resist;
   wherein the mixture of peroxide and one of acid or base is delivered to the surface of the substrate continuously and the water is delivered in pulses while the mixture is delivered.

2. The process as claimed in claim 1, wherein the mixture is a mixture of the peroxide and acid, and wherein the acid is sulphuric acid.

3. The process as claimed in claim 2, wherein the peroxide is hydrogen peroxide.

4. The process as claimed in claim 2, wherein the peroxide is provided as an aqueous solution having a concentration of 10 to 70 wt %.

5. The process as claimed in claim 2, wherein the temperature of at least part of the mixture at the surface reaches 135 degrees ° C. or more during the delivery of the water to the surface.

6. The process as claimed in claim 1, wherein the mixture is a mixture of the peroxide and base, and wherein the base is ammonium hydroxide.

7. The process as claimed in claim 6, wherein the peroxide is hydrogen peroxide.

8. The process as claimed in claim 6, wherein the temperature of at least part of the mixture at the surface reaches 135 degrees ° C. or more during the delivery of the water to the surface.

9. The process as claimed in claim 1, wherein the peroxide is hydrogen peroxide.

10. The process as claimed in claim 1, wherein the peroxide is provided as an aqueous solution having a concentration of 10 to 70 wt %.

11. The process as claimed in claim 1, wherein the acid and peroxide are delivered to the surface in a weight ratio of 1:0.01 to 1:0.5 acid:peroxide.

12. The process as claimed in claim 1, wherein the substrate is being rotated.

13. The process as claimed in claim 1, wherein the temperature of at least part of the mixture at the surface reaches 135 degrees ° C. or more during the delivery of the water to the surface.

14. The process as claimed in claim 1, wherein a layer of resist is present on the surface of the substrate and the process further comprises ion implantation of the resist-covered surface prior to the delivery of the acid or base, peroxide, and water.

15. The process as claimed in claim 1, wherein the water is delivered in pulses of 1 to 5 seconds with a 1 to 5 second interval between pulses.

16. The process as claimed in claim 1, wherein the ratio of time of a pulse of water (t1) and the interval (t2) until the a next pulse of water is 1:1 to 1:5 t1:t2.

17. The process as claimed in claim 1, wherein the substrate comprises at least one of the group consisting of silicon, germanium, and gallium arsenide.

18. The process as claimed in claim 1, wherein the mixture is a mixture of the peroxide and acid, and wherein the acid is phosphoric acid.

19. The process as claimed in claim 1, wherein the base and peroxide are delivered to the surface in a weight ratio of 1:0.01 to 1:0.5 base:peroxide.

20. A semiconductor processing system comprising:
a substrate holder to hold a substrate;
a first delivery system connected to a water source to deliver water;
a second delivery system connected to a source of peroxide and a source of concentrated acid or base; and
a controller arranged to control the first and second delivery systems, the controller comprising instructions for, when executed by the controller, delivering the water and a mixture of peroxide and acid or base separately and concurrently to the surface of the substrate and allow them to mix on the surface, and instructions for delivering the mixture of peroxide and acid or base continuously and the water in pulses while the mixture is delivered.

* * * * *